(12) United States Patent
Obata et al.

(10) Patent No.: US 10,720,886 B2
(45) Date of Patent: Jul. 21, 2020

(54) OSCILLATOR, ELECTRONIC APPARATUS, AND VEHICLE

(71) Applicant: SEIKO EPSON CORPORATION, Tokyo (JP)

(72) Inventors: Naohisa Obata, Minowa-machi (JP); Shinya Aoki, Minowa-machi (JP); Shiro Murakami, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/287,037

(22) Filed: Feb. 27, 2019

(65) Prior Publication Data
US 2019/0267943 A1 Aug. 29, 2019

(30) Foreign Application Priority Data
Feb. 28, 2019 (JP) .................................. 2018-035889

(51) Int. Cl.
| | | |
|---|---|---|
| H03B 5/04 | (2006.01) | |
| H03B 5/36 | (2006.01) | |
| H03L 1/02 | (2006.01) | |
| H03L 1/04 | (2006.01) | |
| H01L 23/04 | (2006.01) | |
| H01L 23/00 | (2006.01) | |

(Continued)

(52) U.S. Cl.
CPC .............. *H03B 5/04* (2013.01); *H01L 23/04* (2013.01); *H01L 23/20* (2013.01); *H01L 24/48* (2013.01); *H01L 25/165* (2013.01); *H03B 5/36* (2013.01); *H03L 1/022* (2013.01); *H03L 1/028* (2013.01); *H01L 24/32* (2013.01); *H01L 24/73* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H03B 2200/0018* (2013.01); *H03L 1/04* (2013.01)

(58) Field of Classification Search
CPC .... H03B 5/04; H03B 5/02; H03B 5/32; H03L 1/028; H03L 1/02; H03L 1/04; H03H 9/02102; H03H 9/17; H03H 9/19; H03H 9/02448; H03H 9/0547; H03H 9/0552; H03H 9/08; H03H 9/0514; H03H 9/0557
See application file for complete search history.

(56) References Cited

U.S. PATENT DOCUMENTS

2017/0373637 A1* 12/2017 Kondo ............... H03H 9/02102

FOREIGN PATENT DOCUMENTS

| JP | 2000-134058 A | 5/2000 |
|---|---|---|
| JP | 2010-220152 A | 9/2010 |
| JP | 5208704 B2 | 6/2013 |

* cited by examiner

*Primary Examiner* — Ryan Johnson
(74) *Attorney, Agent, or Firm* — Oliff PLC

(57) ABSTRACT

An oscillator includes a resonation element, a temperature sensitive element, a first package that houses the resonation element and the temperature sensitive element and is airtightly sealed, and a second package that houses the first package and is airtightly sealed. The first package includes a first base having a first recessed portion that is provided on one main surface side and a first lid that is joined to the first base so as to close an opening of the first recessed portion. The second package includes a second base having a second recessed portion that is provided on one main surface side and a second lid that is joined to the second base so as to close an opening of the second recessed portion.

15 Claims, 12 Drawing Sheets

(51) Int. Cl.
*H01L 23/20* (2006.01)
*H01L 25/16* (2006.01)

OSCILLATOR, ELECTRONIC APPARATUS, AND VEHICLE

BACKGROUND

1. Technical Field

The present invention relates to an oscillator, an electronic apparatus, and a vehicle.

2. Related Art

In related art, an oscillator using a quartz crystal resonation element is known. JP-A-2000-134058 describes an oscillator that houses an inner package in which a resonation element is placed in an outer package on which a circuit element is placed.

However, in the oscillator of JP-A-2000-134058, since the circuit element is housed in the outer package, while the resonation element is housed in the inner package, the degree of the thermal influence from the outside greatly differs between the circuit element and the resonation element. For this reason, for example, in a case where the oscillator of JP-A-2000-134058 is used as a temperature compensated oscillator in which a temperature sensor is provided in the circuit element, there is a problem that the temperature compensation function of the oscillator deteriorates.

SUMMARY

An oscillator according to an application example of the invention includes a resonation element, a temperature sensitive element, a first package that houses the resonation element and the temperature sensitive element and is airtightly sealed, and a second package that houses the first package and is airtightly sealed, in which the first package includes a first base that has two first main surfaces and a first recessed portion provided on one of the first main surfaces and a first lid that is joined to the first base so as to close an opening of the first recessed portion, and the second package includes a second base that has two second main surfaces and a second recessed portion provided on one of the second main surfaces and a second lid that is joined to the second base so as to close an opening of the second recessed portion.

In the oscillator according to the application example of the invention, it is preferable that the first package includes a first internal terminal that is disposed so as to face an inside of the first recessed portion of the first base and a first external terminal that is disposed on the other first main surface of the first base and electrically connected to the first internal terminal, and the second package includes a second internal terminal that is disposed so as to face an inside of the second recessed portion of the second base and a second external terminal that is disposed on the other second main surface of the second base and electrically connected to the second internal terminal.

In the oscillator according to the application example of the invention, it is preferable that the first package is attached to the second base via the first base.

It is preferable that the oscillator according to the application example of the invention further includes a conductive first joining member that is positioned between the first base and the second base and joins the first base and the second base, and that the first external terminal and the second internal terminal are electrically connected via the first joining member.

In the oscillator according to the application example of the invention, it is preferable that the first package is attached to the second base via the first lid.

It is preferable that the oscillator according to the application example of the invention further includes a first joining member that is positioned between the first lid and the second base and joins the first lid and the second base, and a first bonding wire for electrically connecting the first external terminal and the second internal terminal.

In the oscillator according to the application example of the invention, it is preferable that the temperature sensitive element is a thermistor.

It is preferable that the oscillator according to the application example of the invention further includes a circuit element on which a temperature compensation circuit including the temperature sensitive element is formed, and that the circuit element is housed in the first package.

It is preferable that the oscillator according to the application example of the invention further includes a conductive second joining member for attaching the circuit element to the first package, and that the circuit element and the first internal terminal are electrically connected via the second joining member.

It is preferable that the oscillator according to the application example of the invention further includes a second joining member for attaching the circuit element to the first package, and a second bonding wire for electrically connecting the circuit element and the first internal terminal.

In the oscillator according to the application example of the invention, it is preferable that an inside of the first package is filled with an inert gas.

In the oscillator according to the application example of the invention, it is preferable that a pressure in the second package is lower than a pressure in the first package.

In the oscillator according to the application example of the invention, it is preferable that an inside of the second package is depressurized with respect to an atmospheric pressure.

An electronic apparatus according to an application example of the invention includes the oscillator of the application example.

A vehicle according to an application example of the invention includes the oscillator of the application example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an oscillator, an electronic apparatus, and a vehicle according to the invention will be described in detail based on embodiments shown in the accompanying drawings.

First Embodiment

First, an oscillator according to a first embodiment of the invention will be described.

Figure 1:
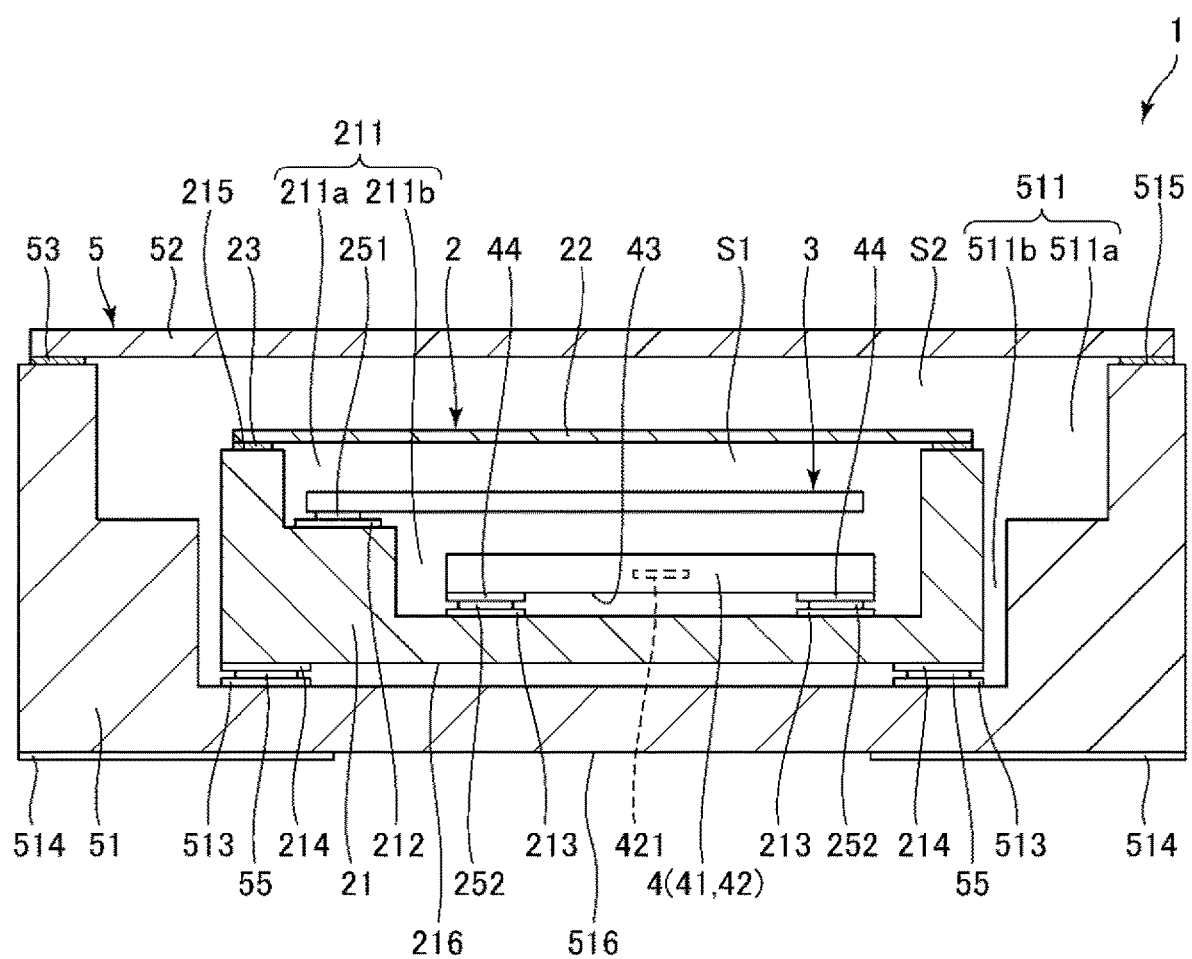
FIG. 1 is a cross-sectional view of an oscillator according to a first embodiment of the invention.
Figure 2:
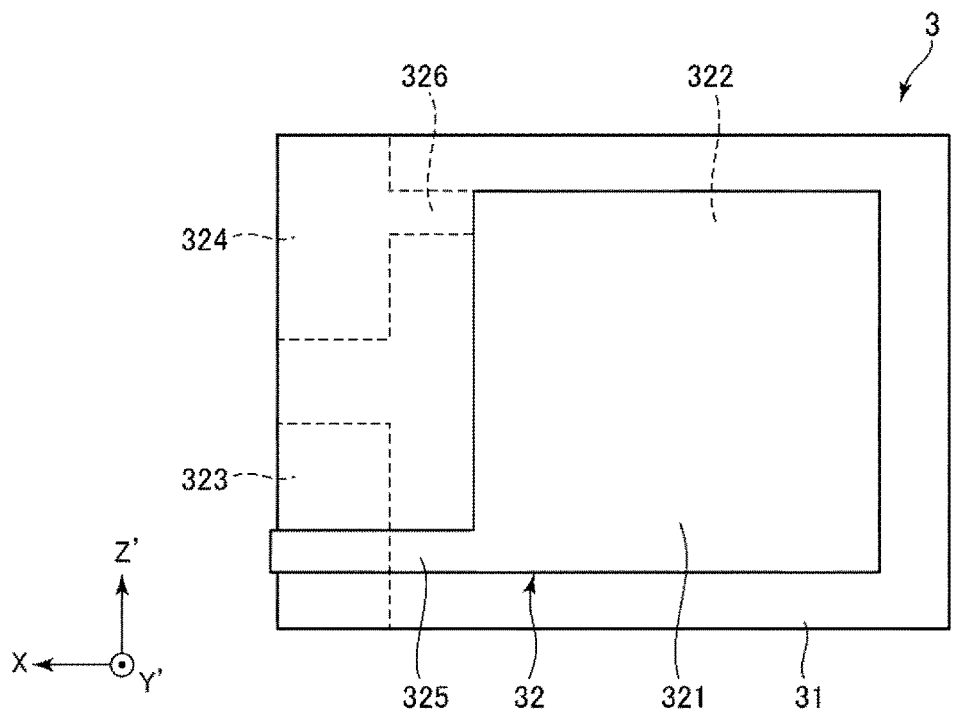
FIG. 2 is a plan view of a resonation element included in the oscillator shown in FIG. 1.
Figure 3:
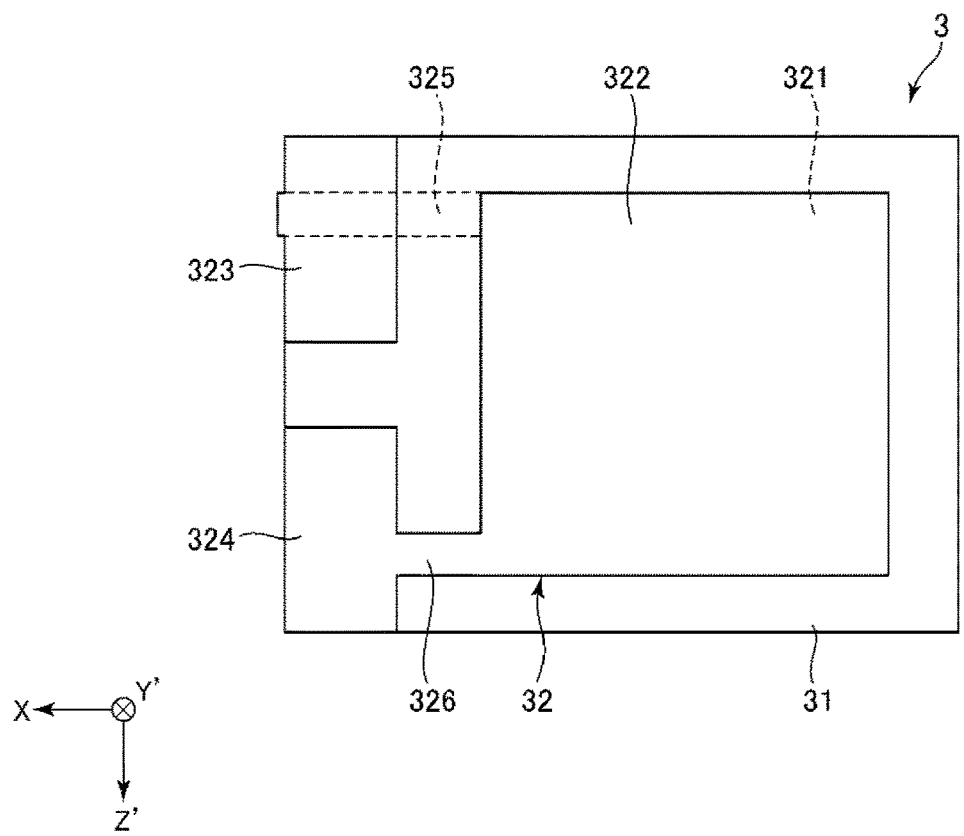
FIG. 3 is a plan view of the resonation element included in the oscillator shown in FIG. 1.
Figure 4:
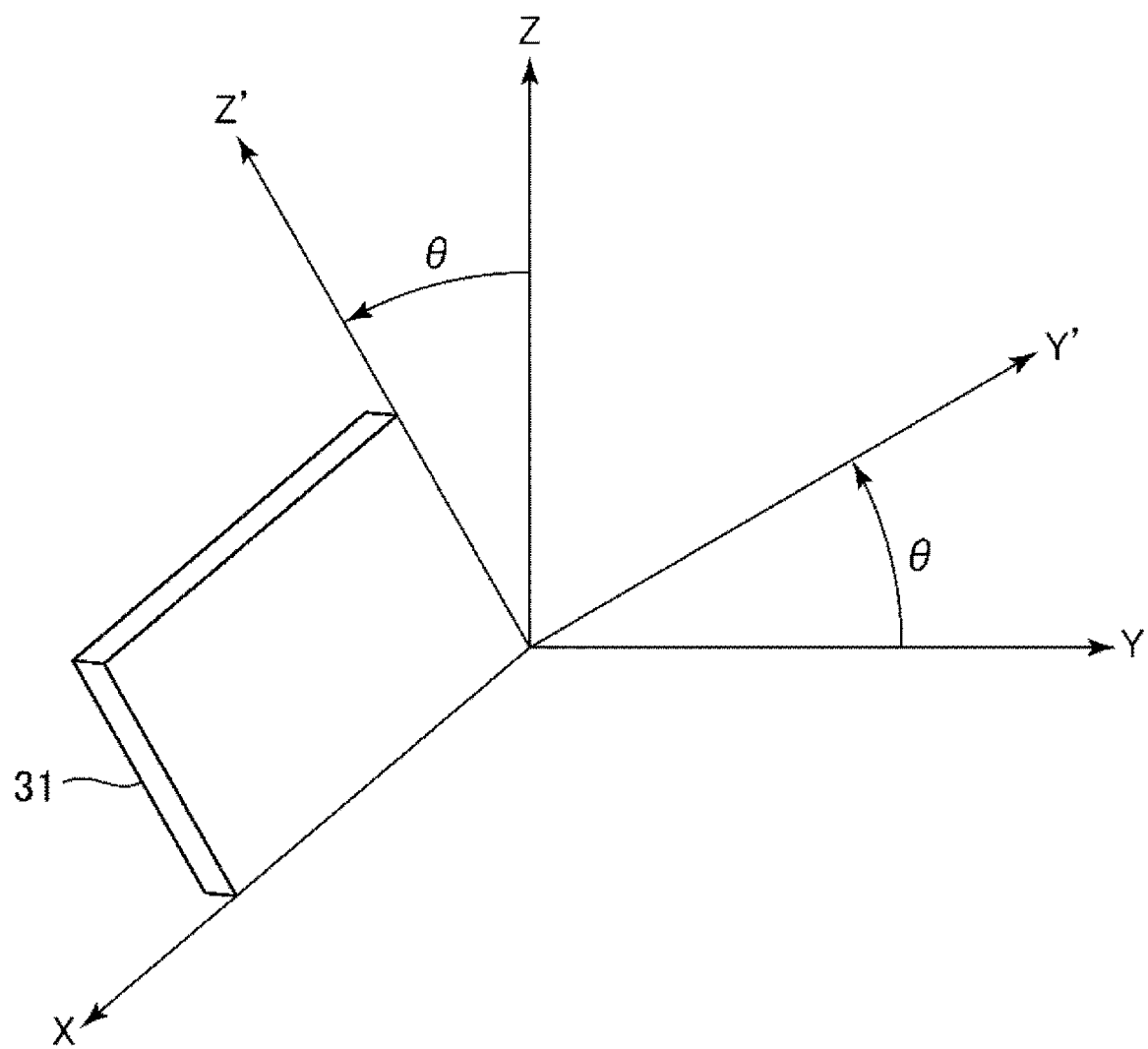
FIG. 4 is a diagram for describing a relationship between an AT-cut quartz crystal substrate and a crystal axis of quartz crystal.
Figure 5:
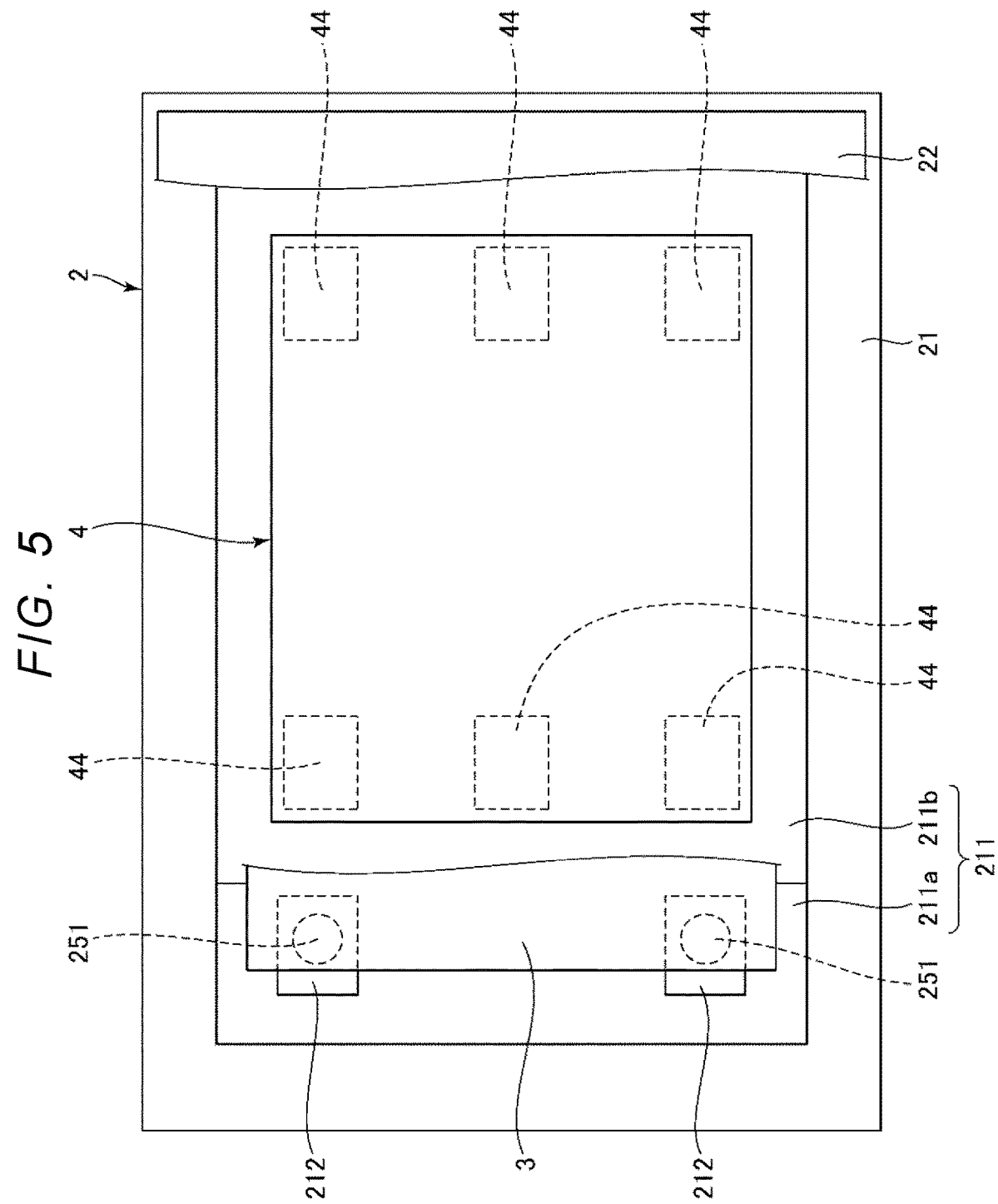
FIG. 5 is a plan view showing the inside of a first package included in the oscillator shown in FIG. 1.

FIG. 1 is a cross-sectional view of the oscillator according to the first embodiment of the invention. FIGS. 2 and 3 are plan views of a resonation element included in the oscillator shown in FIG. 1, respectively. FIG. 4 is a diagram for describing a relationship between an AT-cut quartz crystal substrate and a crystal axis of quartz crystal. FIG. 5 is a plan view showing the inside of a first package included in the oscillator shown in FIG. 1. Hereinafter, for convenience of description, the upper side in FIG. 1 is also referred to as "upper" and the lower side is also referred to as "lower". In addition, hereinafter, for convenience of description, the plan view when FIG. 1 is viewed from the upper side is simply referred to as "plan view".

An oscillator 1 shown in FIG. 1 is an oscillator that generates a reference signal such as a clock signal and is particularly a temperature-compensated crystal oscillator (TCXO). Such the oscillator 1 includes an inner package 2 (first package), a resonation element 3 and a circuit element 4 (IC chip) housed in the inner package 2, and an outer package 5 (second package) that houses the inner package 2. In this way, by double sealing the resonation element 3 and the circuit element 4 with the inner package 2 and the outer package 5, heat insulation increases, external heat is less likely to be transmitted to the resonation element 3 and the circuit element 4, and the temperature change of the resonation element 3 and the circuit element 4 may be reduced. Therefore, it is possible to realize the temperature compensation function by the circuit element 4 with high accuracy and to obtain the oscillator 1 having a stable temperature characteristic. Hereinafter, such the oscillator 1 will be described in detail.

Inner Package

As shown in FIG. 1, the inner package includes a flat base 21 (first base) having a pair of upper surfaces 215 (one first main surface) and a bottom surface 216 (the other first main surface) opposed in the vertical direction, and a lid 22 (first lid). More specifically, the inner package 2 includes a box-shaped base 21 having a recessed portion 211 (first recessed portion) that opens on the upper surface 215, the lid 22 joined to the upper surface 215 of the base 21 so as to close the opening of the recessed portion 211, and a seal ring 23 positioned between the base 21 and the lid 22 and joining the base 21 and the lid 22.

In addition, the recessed portion 211 includes a recessed portion 211a that opens on the upper surface 215 of the base 21 and a recessed portion 211b that opens on the bottom surface of the recessed portion 211a. The lid 22 has a plate shape and is joined to the upper surface 215 of the base 21 via the seal ring 23 so as to close the opening of the recessed portion 211. The seal ring 23 has a frame shape and is positioned between the upper surface 215 of the base 21 and the lid 22. The seal ring 23 is made of a metal material, and the base 21 and the lid 22 are airtightly joined by melting the seal ring 23. A storage space S1 is formed by closing the opening of the recessed portion 211 with the lid 22, and the resonation element 3 and the circuit element 4 are housed in the storage space S1, respectively.

The storage space S1 is an airtight space and is filled with an inert gas such as nitrogen, helium, argon, or the like, for example. As a result, since the state of the storage space S1 is stabilized, the resonation characteristic of the resonation element 3 may be stabilized. In addition, heat convection occurs in the storage space S1, and therefore the thermal coupling between the resonation element 3 and the circuit element 4 is improved (thermal bonding is promoted) and the temperature difference between the resonation element 3 and the circuit element 4 may be suppressed to be smaller. However, the atmosphere of the storage space S1 is not particularly limited and may be in a depressurized state, for example. In the case of a depressurized state, it is preferable that the storage space S1 is in a state closer to vacuum (for example, 10 Pa or less).

The constituent material of the base 21 is not particularly limited, but various ceramics such as aluminum oxide may be used, for example. In this case, the base 21 may be manufactured by firing the laminate of the ceramic sheets (green sheets). In addition, the constituent material of the lid 22 is not particularly limited, but various metal materials (including alloys), for example, may be used. Specifically, it is preferable that the lid 22 is a member having a coefficient of linear expansion close to that of the constituent material of the base 21. For example, in a case where the constituent material of the base 21 is ceramics as described above, it is preferable to use an alloy such as Kovar.

In addition, a plurality of internal terminals 212 are arranged on the bottom surface of the recessed portion 211a, a plurality of internal terminals 213 are arranged on the bottom surface of the recessed portion 211b, and a plurality of external terminals 214 are arranged on the bottom surface 216 of the base 21. In addition, each internal terminal 213 is electrically connected to the internal terminal 212 or the external terminal 214 via internal wiring (not shown) formed in the base 21. The number of the internal terminals 212 and 213 and the number of the external terminals 214 are not particularly limited and may be appropriately set depending on the number of electrodes included in the resonation element 3 and the number of terminals 44 included in the circuit element 4.

Resonation Element

As shown in FIGS. 2 and 3, the resonation element 3 includes a resonation substrate 31 and an electrode 32 disposed on the resonation substrate 31. The resonation substrate 31 is made of a piezoelectric material, and in particular, in the present embodiment, is made of quartz crystal. As a result, the resonation element 3 having an excellent frequency temperature characteristic may be obtained as compared with other piezoelectric materials.

The piezoelectric material is not limited to quartz crystal but may be lithium niobate (LiNbO$_3$), lithium tantalate (LiTaO$_3$), lead zirconate titanate (PZT), lithium tetraborate (Li$_2$B$_4$O$_7$), langasite (La$_3$Ga$_5$SiO$_{14}$), potassium niobate (KNbO$_3$), gallium phosphate (GaPO$_4$), gallium arsenide (GaAs), aluminum nitride (AlN), zinc oxide (ZnO, Zn$_2$O$_3$), barium titanate (BaTiO$_3$), lead titanate (PbPO$_3$), sodium potassium sodium niobate ((K, Na) NbO$_3$), bismuth ferrite (BiFeO$_3$), sodium niobate (NaNbO$_3$), bismuth titanate (Bi4Ti$_3$O$_{12}$), bismuth sodium titanate (Na$_{0.5}$Bi$_{0.5}$TiO$_3$), or the like, for example.

The resonation substrate 31 has a thickness shear resonation mode, and in the embodiment, is formed from an AT-cut quartz crystal substrate. As shown in FIG. 4, the AT-cut quartz crystal substrate is a "rotated Y-cut quartz crystal substrate" cut along a plane obtained by rotating an XZ plane around an X axis at an angle θ (=35° 15'). Since the AT-cut quartz crystal substrate has a third-order frequency temperature characteristic, the resonation element 3 having an excellent temperature characteristic may be obtained by forming the resonation substrate 31 from the AT-cut quartz crystal substrate. Hereinafter, an Y axis and a Z axis rotated about the X axis corresponding to the angle θ are referred to as an Y' axis and a Z' axis. That is, the resonation substrate 31 has a thickness in the Y' axis direction and is spread in an XZ' plane direction.

The electrode 32 includes an excitation electrode 321 disposed on the upper surface of the resonation substrate 31 and an excitation electrode 322 disposed on the lower surface so as to face the excitation electrode 321. In addition, the electrode 32 includes a pair of pad electrodes 323 and 324 disposed on the lower surface of the resonation substrate 31, a wiring 325 for electrically connecting a pad electrode 323 and the excitation electrode 321, and a wiring 326 for electrically connecting a pad electrode 324 and the excitation electrode 322. Then, the resonation substrate 31 is subjected to thickness shear resonation by applying a drive signal (alternating voltage) between the excitation electrodes 321 and 322.

As shown in FIG. 5, such the resonation element 3 is fixed to the bottom surface of the recessed portion 211a via a pair of joining members 251. In addition, one joining member 251 electrically connects one internal terminal 212 and the pad electrode 323, and the other joining member 251 electrically connects the other internal terminal 212 and the pad electrode 324.

The joining member 251 is not particularly limited as long as the joining member 251 has both conductivity and joining property, and for example, various metal bumps such as a gold bump, a silver bump, a copper bump, a solder bump, a conductive adhesive in which a conductive filler such as a silver filler is dispersed in various adhesives of polyimide type, epoxy type, silicone type, and acrylic type, or the like may be used. However, among these, it is preferable to use a conductive adhesive as the joining member 251. Thereby, the joining member 251 becomes comparatively soft, and resonation leakage of the resonation element 3 may be reduced.

Although the resonation element 3 has been described above, the configuration of the resonation element 3 is not limited to the above-described configuration. For example, the resonation element 3 may have a mesa shape in which the resonation region (region sandwiched between the excitation electrodes 321 and 322) of the resonation substrate 31 protrudes from the surroundings thereof, or on the contrary, may have an inverted mesa shape in which the resonation region is recessed from the surroundings. In addition, beveling for grinding the periphery of the resonation substrate 31 or convex processing with convex curved surfaces on the upper and lower surfaces may be applied. In addition, the resonation element 3 is not limited to resonation in the thickness shear resonation mode, and for example, a plurality of resonation arms may be flexural resonations (tuning fork resonations) in the in-plane direction, or the plurality of resonation arms may be flexural resonations (walking resonations) in the out-of-plane direction.

Circuit Element

As shown in FIG. 1, the circuit element 4 is housed in the storage space S1. In addition, the circuit element 4 includes an active surface 43 on which the terminal 44 is disposed and is disposed such that the active surface 43 faces downward. Such the circuit element 4 is fixed to the bottom surface of the recessed portion 211b via a plurality of joining members 252. In addition, the plurality of joining members 252 electrically connect the terminal 44 of the circuit element 4 and the internal terminal 213. That is, the circuit element and the inner package 2 are mechanically fixed and electrically connected by the plurality of joining members 252. The joining member 252 is not particularly limited as long as the joining member 252 has both conductivity and joining property, and for example, various metal bumps such as a gold bump, a silver bump, a copper bump, a solder bump, a conductive adhesive in which a conductive filler such as a silver filler is dispersed in various adhesives of polyimide type, epoxy type, silicone type, and acrylic type, or the like may be used.

In addition, the circuit element 4 includes an oscillation circuit 41 for oscillating the resonation element 3 to generate a frequency of a reference signal such as a clock signal and a temperature compensation circuit 42 for correcting the frequency of the reference signal generated by the oscillation circuit 41 based on the temperature of the resonation element 3. The temperature compensation circuit 42 is, for example, a circuit having a characteristic opposite to the temperature characteristic of the resonation element and is a circuit for obtaining a good temperature characteristic over a wide temperature range. The temperature compensation circuit 42 includes a temperature sensitive element 421 for detecting the temperature of the resonation element 3 and corrects the frequency of the reference signal based on the output from the temperature sensitive element 421. Here, as described above, since both the resonation element 3 and the circuit element 4 are attached to the base 21 and housed in storage space S1, the thermal coupling between the resonation element 3 and the circuit element 4 is improved (thermal bonding is promoted) and the temperature difference between the resonation element 3 and the circuit element 4 may be suppressed to be smaller. Therefore, the temperature of the resonation element 3 may be accurately detected by the temperature sensitive element 421, and the circuit element 4 may realize an excellent temperature compensation function.

The temperature sensitive element 421 is not particularly limited, but in the embodiment, a temperature sensor utilizing the temperature dependence of the band gap voltage of the PN junction is used. As a result, it is easier to make the temperature sensitive element 421 in the circuit element 4, and it is possible to accurately detect the temperature of the resonation element 3.

Outer Package

As shown in FIG. 1, the outer package 5 includes a flat base 51 (a second base) having a pair of an upper surface 515 (one second main surface) and a bottom surface 516 (the other second main surface) opposed in the vertical direction, and a lid 52 (a second lid). More specifically, the outer package 5 includes a box-shaped base 51 having a recessed portion 511 that opens on the upper surface 515, the lid 52 joined to the upper surface 515 of the base 51 so as to close the opening of the recessed portion 511, and a seal ring 53 positioned between the base 51 and the lid 52 and joining the base 51 and the lid 52.

In addition, the recessed portion 511 includes a recessed portion 511a that opens on the upper surface 515 of the base 51 and a recessed portion 511b that opens on the bottom surface of the recessed portion 511a. The lid 52 has a plate shape and is joined to the upper surface 515 of the base 51 via the seal ring 53 so as to close the opening of the recessed portion 511. The seal ring 53 has a frame shape and is positioned between the upper surface 515 of the base 51 and the lid 52. The seal ring 53 is made of a metal material, and the base 51 and the lid 52 are airtightly joined by melting the seal ring 53. In this way, the opening of the recessed portion 511 is closed with the lid 52 to form a storage space S2, and the inner package 2 is housed in the storage space S2.

The storage space S2 is an airtight space and is in a depressurized state, for example, which is replaced with an inert gas such as nitrogen, helium, or argon. That is, the pressure in the outer package 5 is lower than the pressure in the inner package 2. As the depressurized state, the closer to vacuum is, the more preferable it is, for example, 10 Pa or less. In this way, it is possible to reduce the heat convection generated in the storage space S2 by setting the storage space S2 in a depressurized state. Therefore, heat outside the outer package 5 is less likely to be transmitted to the inner package 2 via the storage space S2, and as a result, it is difficult for external heat to be transmitted to the resonation element 3 and the circuit element 4. Therefore, the temperatures of the resonation element 3 and the circuit element 4 are stabilized. Furthermore, the temperature difference between the resonation element 3 and the circuit element 4 may also be kept small. Therefore, the temperature of the resonation element 3 may be accurately detected by a temperature sensitive element 421 of the circuit element 4, and it is possible to realize the temperature compensation function by the circuit element 4 with high accuracy and to obtain the oscillator 1 having a stable temperature characteristic. However, the atmosphere of the storage space S2 is not particularly limited and may be atmospheric pressure, for example.

The constituent material of the base 51 is not particularly limited, but various ceramics such as aluminum oxide may be used, for example. In this case, the base 51 may be manufactured by firing the laminate of the ceramic sheets (green sheets). In addition, the constituent material of the lid 52 is not particularly limited, but various metal materials (including alloys), for example, may be used. Specifically, it is preferable that the lid 52 is a member having a coefficient of linear expansion close to that of the constituent material of the base 51. For example, in a case where the constituent material of the base 51 is ceramics as described above, it is preferable to use an alloy such as Kovar.

In addition, a plurality of internal terminals 513 are arranged on the bottom surface of the recessed portion 511b, and a plurality of external terminals 514 are arranged on a bottom surface 516 of the base 51. Each internal terminal 513 is electrically connected to the corresponding external terminal 514 via internal wiring (not shown) formed in the base 51.

Here, the inner package 2 is housed in the storage space S2 in a posture in which the bottom surface 216 (the surface on which the external terminal 214 is disposed) of the base 21 faces downward. In addition, the inner package 2 is fixed to the bottom surface of the recessed portion 511b via a plurality of metal bumps 55 (first joining members). In addition, the plurality of metal bumps 55 electrically connect the external terminals 214 of the inner package 2 and the internal terminals 513 of the outer package 5. That is, the inner package 2 and the outer package 5 are mechanically fixed and electrically connected by the plurality of metal bumps 55. The metal bump 55 is not particularly limited, and for example, a gold bump, a silver bump, a copper bump, a solder bump or the like may be used. In addition, the number of the metal bumps 55 is not particularly limited and may be appropriately set according to the number of the external terminals 214 and the internal terminals 513.

Here, since substantially no outgas is generated from the metal bumps 55, the pressure in the storage space S2 may be maintained at a lower level (increase in pressure over time may be suppressed). Therefore, it is possible to reduce the heat convection generated in the storage space S2 and to effectively reduce the temperature fluctuation of the resonation element 3 and the circuit element 4 due to external heat. However, the joining member (first joining member) for fixing the inner package 2 to the outer package 5 is not limited to the metal bump 55, but may be a metal joining material such as solder, gold braze, silver brazing or the like, a conductive adhesive, or the like, for example.

The oscillator 1 of the embodiment has been described above. As described above, such the oscillator 1 includes the resonation element 3, the temperature sensitive element 421, the inner package 2 (first package) that houses the resonation element 3 and the temperature sensitive element 421 and is airtightly sealed, and the outer package 5 (second package) that houses the inner package 2 and is airtightly sealed. In addition, the inner package 2 includes the base 21 (first base) having the upper surface 215 and the bottom surface 216 which are two first main surfaces and the recessed portion 211 (first recessed portion) provided on the upper surface 215 side, and the lid 22 (first lid) joined to the base 21 so as to close an opening of the recessed portion 211. Further, the outer package 5 includes the base 51 (second base) having the upper surface 515 and the bottom surface 516 which are two second main surfaces and the recessed portion 511 (second recessed portion) provided on the upper surface 515 side, and the lid 52 (second lid) joined to the base 51 so as to close an opening of the recessed portion 511.

In this way, by housing the resonation element 3 and the temperature sensitive element 421 in the inner package 2 and further housing the inner package 2 in the outer package 5, the external heat is transmitted to the resonation element 3 and the circuit element 4 via the outer package 5 and the inner package 2, and therefore the heat transmission path from the outside to the resonation element 3 and the circuit element 4 may be sufficiently lengthened. Furthermore, as described above, since both the circuit element 4 and the resonation element 3 are attached to the inner package 2, the thermal coupling between the resonation element 3 and the circuit element 4 is improved (thermal bonding is promoted) and the temperature difference between the resonation element 3 and the circuit element 4 may be suppressed to be smaller. Therefore, the temperature of the resonation element 3 may be accurately detected by the temperature sensitive element 421.

With the above effect, it is possible to realize the temperature compensation function by the circuit element 4 with high accuracy and to obtain the oscillator 1 having stable temperature characteristics. In particular, in the embodiment, since the inner package 2 and the outer package 5 are connected by the metal bumps 55, the heat transmission route from the outer package 5 to the inner package 2 may be made sufficiently small (thin). Therefore, external heat is less likely to be transmitted to the resonation element 3, and the above-described effect may be achieved more remarkably.

In addition, as described above, the inner package 2 includes the internal terminals 212 and 213 (first internal terminals) disposed so as to face the inside of the recessed portion 211 of the base 21 and the external terminal 214 (first external terminal) disposed on the bottom surface 216 (the other main surface) of the base 21 and electrically connected to the internal terminals 212 and 213. Further, the outer package 5 includes the internal terminal 513 (second internal terminal) disposed facing the inside of the recessed portion 511 of the base 51 and the external terminal 514 (second external terminal) disposed on the bottom surface 516 (the other main surface) of the base 51 and electrically connected to the internal terminal 513. With such a configuration, it is possible to easily perform electrical connection between the resonation element 3 and the circuit element 4, and the inner package 2, to easily perform electrical connection between the inner package 2 and the outer package 5, and to easily perform electrical connection between the outer package 5 and an external apparatus.

In addition, as described above, the inner package 2 is attached to the base 51 via the base 21. Thereby, the inner package 2 is fixed to the outer package 5, and the posture thereof is stabilized. In particular, in the embodiment, both the base 21 and the base 51 are made of ceramics. For example, the ceramic has a lower thermal conductivity than the metallic material which is the constituent material of the lid 22 and the lid 52. Therefore, external heat is less likely to be transmitted to the resonation element 3 and the circuit element 4. Therefore, the temperature compensation by the temperature compensation circuit 42 may be performed more accurately, and the oscillator 1 having a stable temperature characteristic is obtained.

In addition, as described above, the oscillator 1 is positioned between the base 21 and the base 51 and includes the conductive metal bump 55 (first joining member) for joining the base 21 and the base 51. Then, the external terminal 214 and the internal terminal 513 are electrically connected via the metal bump 55. With such a configuration, since mechanical fixing and electrical connection between the base 21 and the base 51 may be performed by the metal bumps 55, the configuration of the oscillator 1 becomes simpler.

In addition, the temperature sensitive element 421 may be a thermistor. Thereby, the configuration of the temperature sensitive element 421 becomes simple.

In addition, as described above, the oscillator 1 includes the circuit element 4 on which the temperature compensation circuit 42 including the temperature sensitive element 421 is formed. Then, the circuit element 4 is housed in the inner package 2. Thereby, the temperature sensitive element 421 and the resonation element 3 may be disposed closer to each other, and the temperature of the resonation element 3 may be detected more accurately by the temperature sensitive element 421.

Also, as described above, the conductive joining member 252 (second joining member) for attaching the circuit element 4 to the inner package 2 is included, and the circuit element 4 and the internal terminal 213 are electrically connected via the joining member 252. With such a configuration, since the mechanical fixing and electrical connection between the inner package 2 and the circuit element 4 may be performed by the joining member 252, the configuration of the oscillator 1 becomes simpler.

In addition, as described above, the inside of the inner package 2 is filled with an inert gas. As a result, the atmosphere in the inner package 2 is stabilized and the resonation characteristic of the resonation element 3 may be stabilized.

In addition, as described above, the pressure in the outer package 5 is lower than the pressure in the inner package 2. As a result, heat convection is less likely to occur in the outer package 5, and external heat is less likely to be transmitted to the resonation element 3. In particular, in the embodiment, the inside of the outer package 5 is depressurized with respect to the atmospheric pressure. As a result, heat convection in the outer package 5 is less likely to occur, and heat transmission other than heat conduction may be suppressed. Therefore, it is difficult for external heat to be transmitted to the resonation element 3 and the circuit element 4, and temperature fluctuations of the resonation element 3 and the circuit element 4 due to external heat may be more effectively reduced.

Second Embodiment

Next, an oscillator according to a second embodiment of the invention will be described.

Figure 6:
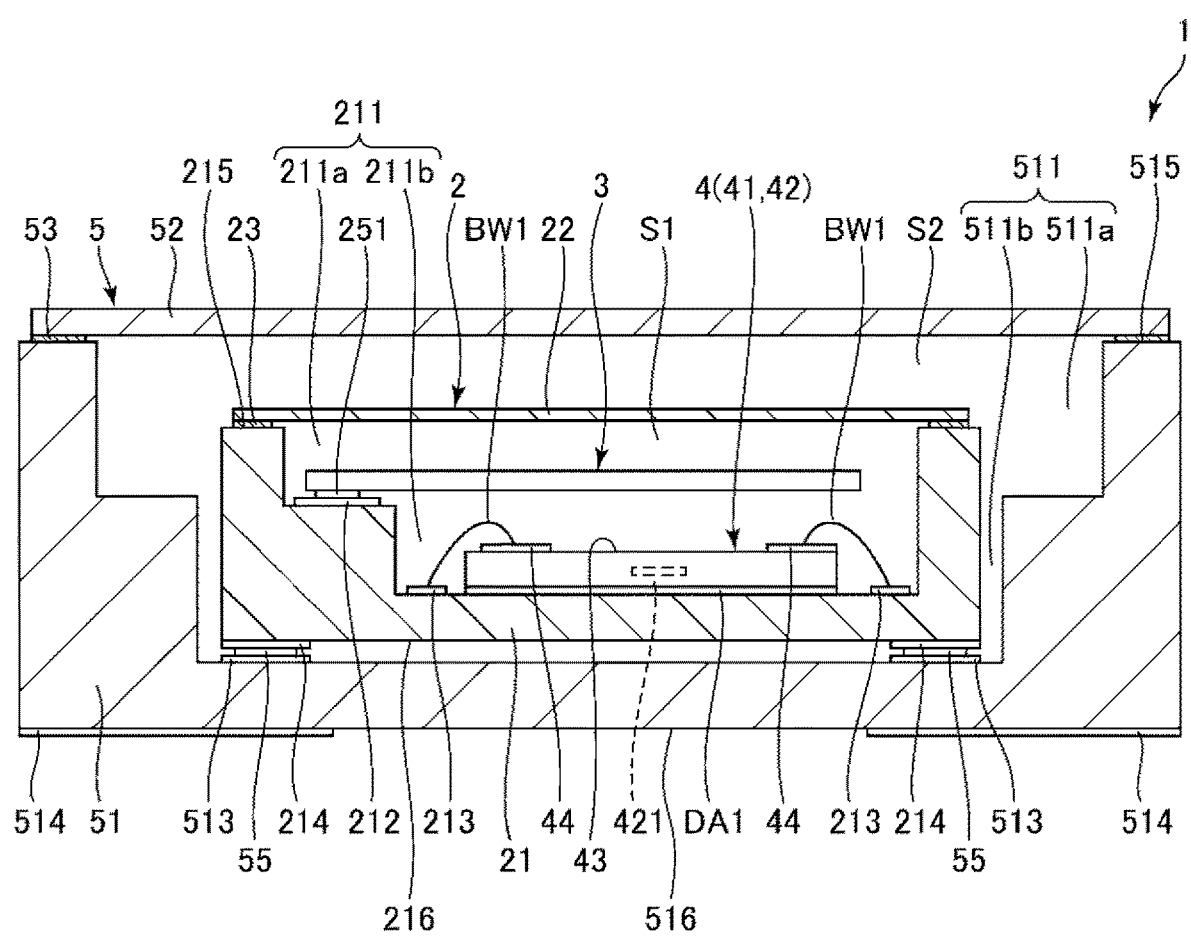
FIG. 6 is a cross-sectional view of an oscillator according to a second embodiment of the invention.

FIG. 6 is a cross-sectional view of the oscillator according to the second embodiment of the invention.

Hereinafter, differences between the oscillator of the second embodiment and the above-described embodiment will be mainly described, and description of similar matters will be omitted. The oscillator of the second embodiment is similar to the oscillator of the first embodiment except that the direction of the circuit element 4 is mainly different. In FIG. 6, the same reference numerals are given to the same configurations as in the above-described embodiment.

As shown in FIG. 6, in the oscillator 1 of the embodiment, the circuit element 4 is fixed to the bottom surface of the recessed portion 211b via a die attach material DA1 (second joining member) such that the active surface 43 faces upward. In addition, the terminal 44 of the circuit element 4 and each internal terminal 213 are electrically connected to each other via a bonding wire BW1 (second bonding wire).

The die attach material DA1 is not particularly limited, and various adhesives such as an epoxy type adhesive and a silicone type adhesive, various metal pastes such as a solder, a gold braze, a silver braze, or the like may be used, for example. However, as the die attach material DA1, it is preferable to use a metal paste. In addition, since substantially no outgas is generated from the metal base, the pressure in the storage space S2 may be maintained at a lower level (increase in pressure over time may be suppressed). Therefore, it is possible to reduce the heat convection generated in the storage space S2 and to effectively reduce the temperature fluctuation of the resonation element 3 due to external heat.

As described above, the oscillator 1 of the embodiment includes the die attach material DA1 (second joining member) for attaching the circuit element 4 to the inner package 2, and the bonding wire BW1 (second bonding wire) for electrically connecting the circuit element 4 and the internal terminal 213. With such a configuration, it is possible to easily perform mechanical fixing and electrical connection between the circuit element 4 and the inner package 2.

According to the second embodiment like this, the same effects as those of the first embodiment described above may be achieved.

Third Embodiment

Next, an oscillator according to a third embodiment of the invention will be described.

Figure 7:
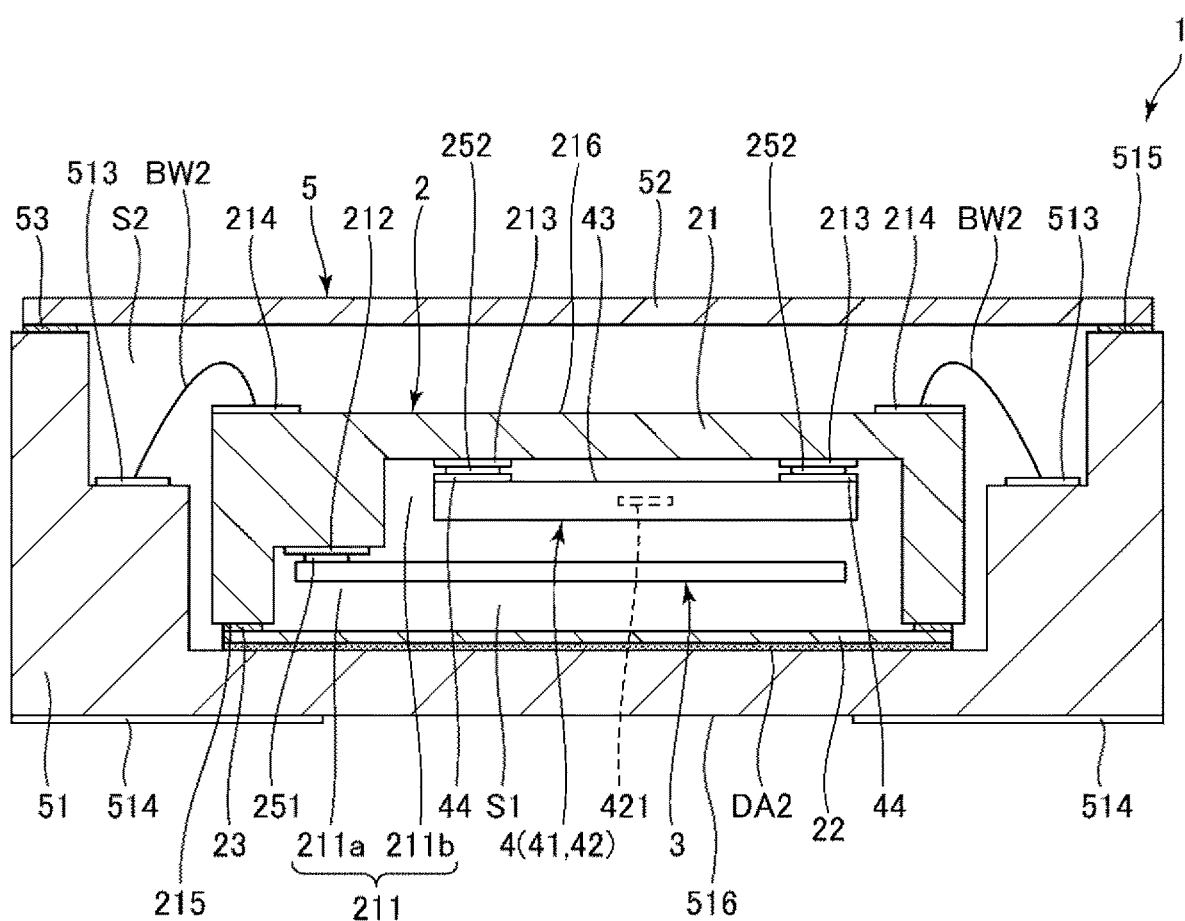
FIG. 7 is a cross-sectional view of an oscillator according to a third embodiment of the invention.

FIG. 7 is a cross-sectional view of the oscillator according to the third embodiment of the invention.

Hereinafter, differences between the oscillator of the third embodiment and the above-described embodiment will be mainly described, and description of similar matters will be omitted. The oscillator of the third embodiment is mainly the same as the oscillator of the first embodiment except that the direction of the inner package is different. In FIG. 7, the same reference numerals are given to the same configurations as in the above-described embodiment.

As shown in FIG. 7, in the oscillator 1 of the embodiment, the inner package 2 is disposed with the bottom surface 216 (the surface on which the external terminal 214 is disposed) of the base 21 facing upward. A die attach material DA2 (first joining member) is disposed between the lid 22 and the base 51, and the lid 22 and the base 51 are mechanically fixed via the die attach material DA2. In addition, the external terminal 214 of the inner package 2 and the internal terminal 513 of the outer package 5 are electrically connected via a bonding wire BW2 (first bonding wire).

The die attach material DA2 is not particularly limited, and various adhesives such as an epoxy type adhesive and a silicone type adhesive, various metal pastes such as a solder, a gold braze, a silver braze, or the like may be used, for example. However, as the die attach material DA2, it is preferable to use a material having a thermal conductivity lower than that of the metal paste, such as an epoxy type adhesive. As a result, it is possible to reduce the heat conduction from the base 51 into the storage space S1, thereby effectively reducing the temperature fluctuation of the resonation element 3 due to external heat.

As described above, in the oscillator 1 of the embodiment, the inner package 2 is attached to the base 51 via the lid 22. Thereby, the inner package 2 is fixed to the outer package 5, and the posture thereof is stabilized.

Also, as described above, the oscillator 1 includes the die attach material DA2 (first joining member) positioned between the lid 22 and the base 51 and joining the lid 22 and the base 51, and the bonding wire BW2 (first bonding wire) for electrically connecting the external terminal 214 and the internal terminal 513. With such a configuration, it is possible to mechanically fix and electrically connect the inner package 2 and the outer package 5 with a simple structure.

According to the third embodiment like this, the same effects as those of the first embodiment described above may be achieved.

Fourth Embodiment

Next, an electronic apparatus according to a fourth embodiment of the invention will be described.

Figure 8:
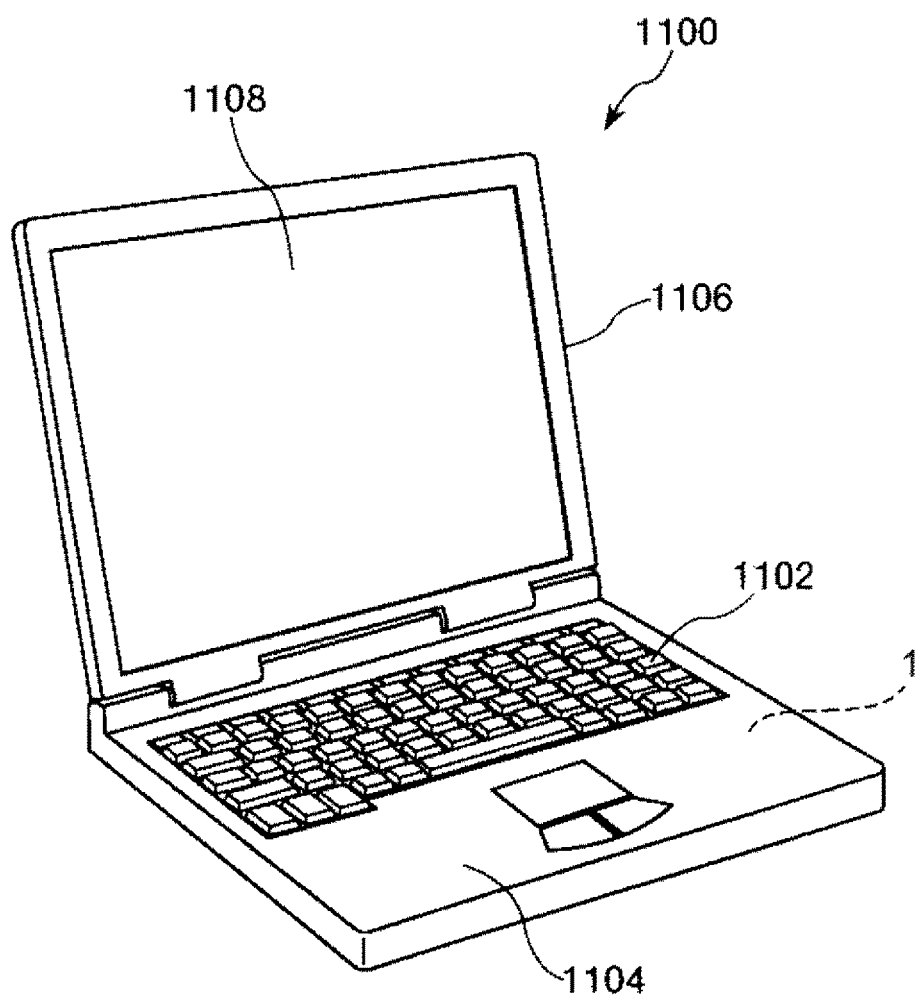
FIG. 8 is a perspective view showing an electronic apparatus according to a fourth embodiment of the invention.

FIG. 8 is a perspective view showing the electronic apparatus according to the fourth embodiment of the invention.

A mobile type (or notebook type) personal computer 1100 shown in FIG. 8 is one to which an electronic apparatus including the oscillator according to the invention is applied. In this diagram, the personal computer 1100 is configured by a main body 1104 having a keyboard 1102 and a display unit 1106 having a display portion 1108, and the display unit 1106 is rotatably supported relative to the main body 1104 via a hinge structure. In addition, the oscillator 1 is built in the personal computer 1100.

Such the personal computer 1100 (electronic apparatus) has an oscillator 1.

Therefore, it is possible to achieve the effect of the above-described oscillator 1 and high reliability.

Fifth Embodiment

Next, an electronic apparatus according to a fifth embodiment of the invention will be described.

Figure 9:
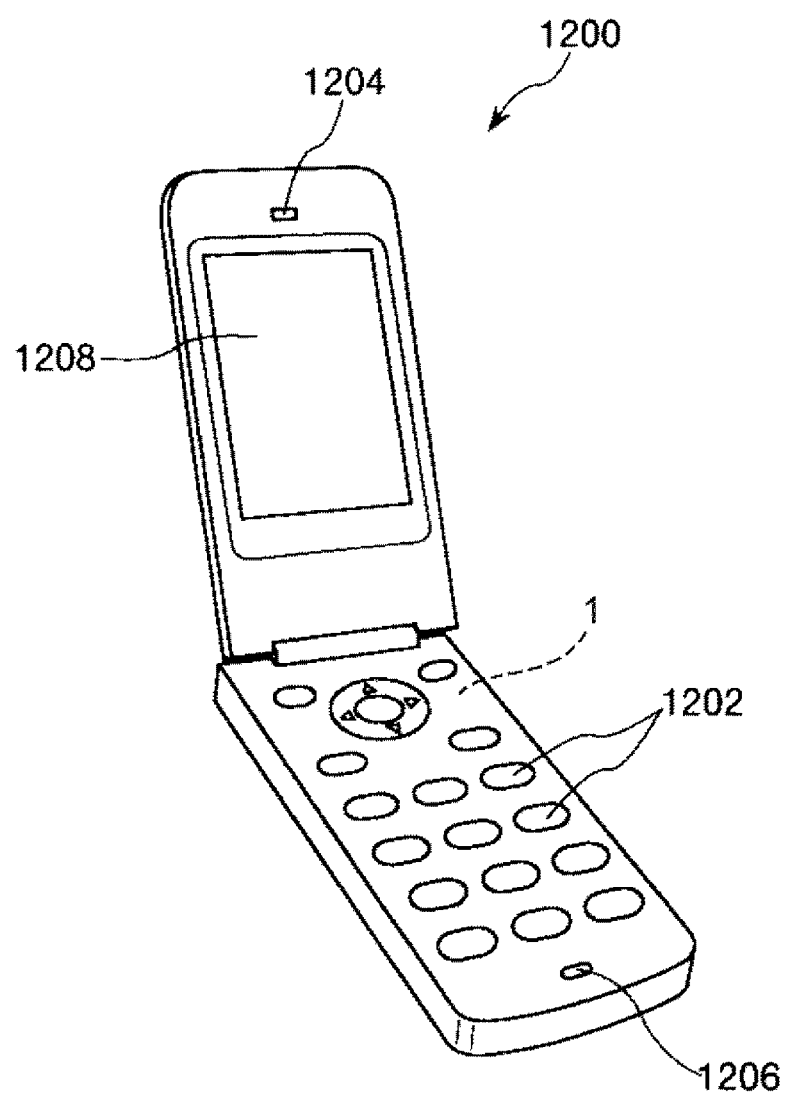
FIG. 9 is a perspective view showing an electronic apparatus according to a fifth embodiment of the invention.

FIG. 9 is a perspective view showing the electronic apparatus according to the fifth embodiment of the invention.

A mobile phone 1200 (including the PHS) shown in FIG. 9 is one to which an electronic apparatus including the oscillator according to the invention is applied. The mobile phone 1200 includes an antenna (not shown), a plurality of operation buttons 1202, an earpiece 1204, and a mouthpiece 1206, and a display unit 1208 is disposed between the operation buttons 1202 and the earpiece 1204. In addition, the oscillator 1 is built in the mobile phone 1200.

The mobile phone 1200 (electronic apparatus) as described above has the oscillator 1. Therefore, it is possible to achieve the effect of the above-described oscillator 1 and high reliability.

Sixth Embodiment

Next, an electronic apparatus according to a sixth embodiment of the invention will be described.

Figure 10:
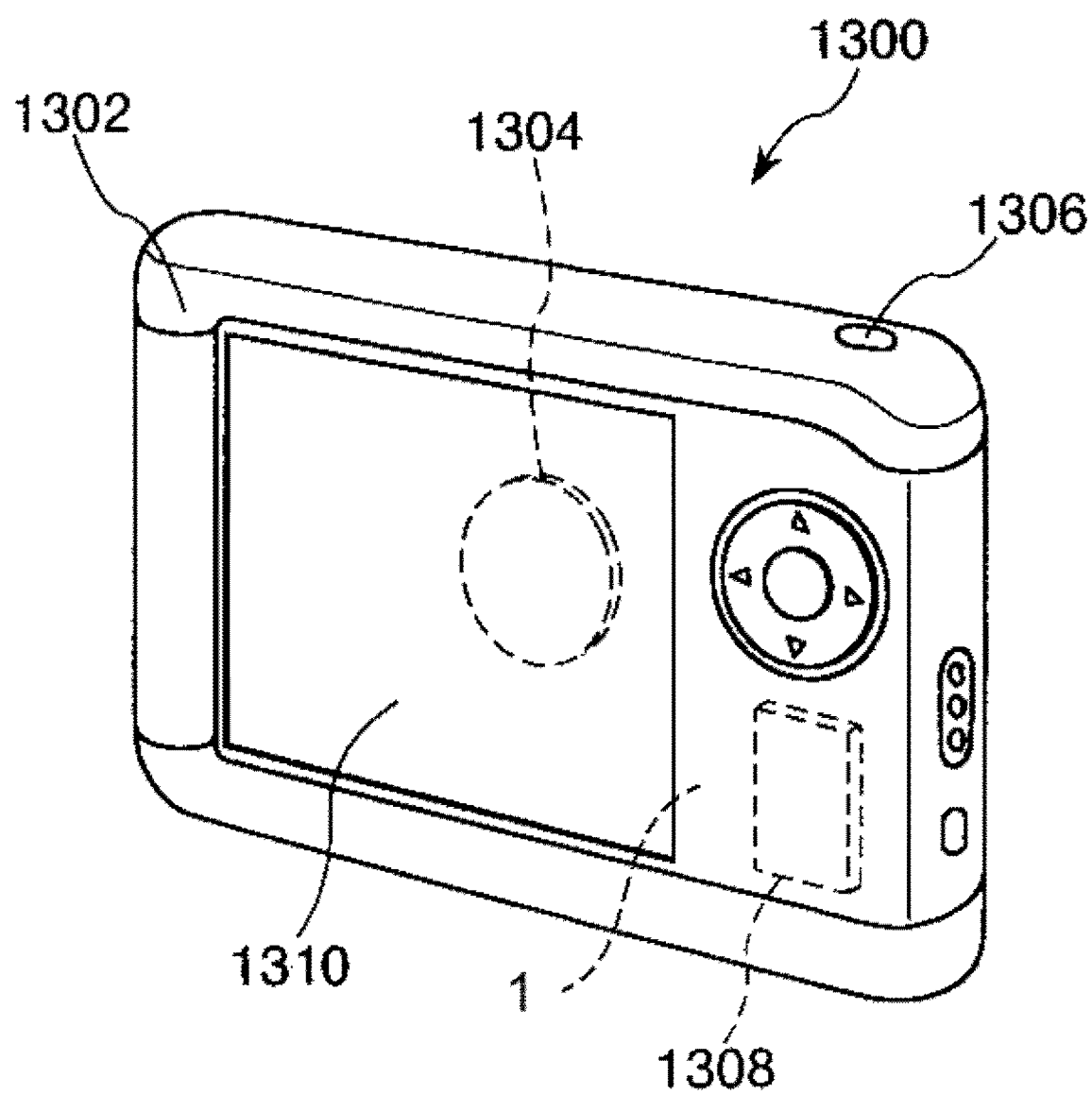
FIG. 10 is a perspective view showing an electronic apparatus according to a sixth embodiment of the invention.

FIG. 10 is a perspective view showing the electronic apparatus according to the sixth embodiment of the invention.

A digital still camera 1300 shown in FIG. 10 is one to which an electronic apparatus including the oscillator according to the invention is applied. A display unit 1310 is provided on the back surface of a case (body) 1302 and is configured to perform display based on imaging signals by a CCD, and the display unit 1310 functions as a finder that displays a subject as an electronic image. In addition, alight receiving unit 1304 including an optical lens (imaging optical system) and a CCD or the like is provided on the front side (back side in the drawing) of the case 1302. When a photographer confirms the subject image displayed on the display unit 1310 and presses a shutter button 1306, the imaging signal of the CCD at that time is transferred and stored in a memory 1308. In addition, the oscillator 1 is built in the digital still camera 1300.

Such the digital still camera 1300 (electronic apparatus) includes the oscillator 1. Therefore, it is possible to achieve the effect of the above-described oscillator 1 and high reliability.

In addition to the personal computer, the mobile phone, and the digital still camera of the embodiments described above, the electronic apparatus according to the invention may be applied to, for example, a smartphone, a tablet terminal, a clock (including a smart watch), an ink jet type discharging device (for example, an ink jet printer), a laptop type personal computer, a television, a wearable terminal such as an head mounted display (HMD), a video camera, a video tape recorder, a car navigation device, a pager, an electronic notebook (including a communication function), an electronic dictionary, a calculator, an electronic game machine, a word processor, a workstation, a TV phone, a security TV monitor, electronic binoculars, a POS terminal, medical equipment (for example, electronic clinical thermometer, blood pressure monitor, blood glucose meter, electrocardiogram measuring device, ultrasonic diagnostic device, electronic endoscope), a fish finder, various measuring instruments, mobile terminal base station equipment, instruments (for example, instruments of vehicles, aircraft, ships), a flight simulator, a network server, and the like.

Seventh Embodiment

Next, a vehicle according to a seventh embodiment of the invention will be described.

Figure 11:
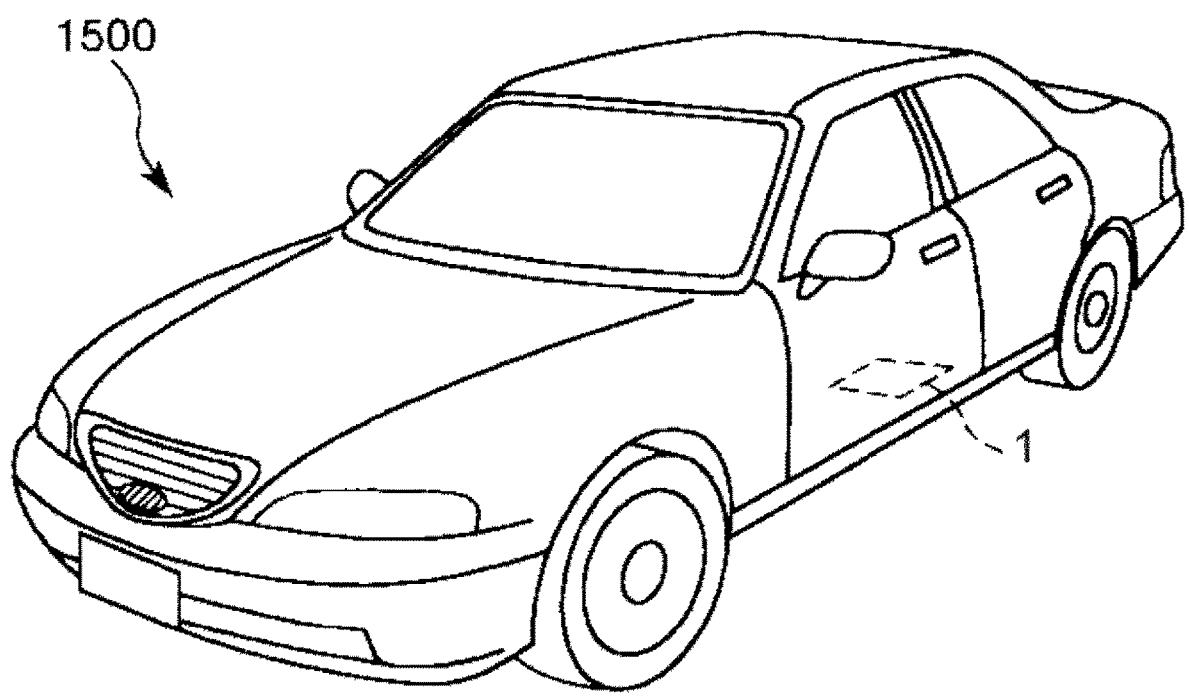
FIG. 11 is a perspective view showing a vehicle according to a seventh embodiment of the invention.

FIG. 11 is a perspective view showing the vehicle according to the seventh embodiment of the invention.

An automobile 1500 shown in FIG. 11 is a vehicle to which a moving object equipped with the oscillator according to the invention is applied. The automobile 1500 has an oscillator 1 built therein.

The oscillator 1 may be widely applied to, for example, keyless entry, immobilizer, car navigation system, car air conditioner, anti-lock brake system (ABS), air bag, tire pressure monitoring system (TPMS), engine control, battery monitor for hybrid cars and electric cars, and electronic control unit (ECU) such as a vehicle body attitude control system.

Such the automobile 1500 (moving object) includes an oscillator 1. Therefore, it is possible to achieve the effect of the above-described oscillator 1 and high reliability.

The moving object is not limited to the automobile 1500 but may also be applied to unmanned airplanes such as an airplane, a ship, an automated guided vehicle (AGV), a biped walking robot, a drone, and the like.

First Reference Example

Next, an oscillator according to a first reference example will be described.

Figure 12:
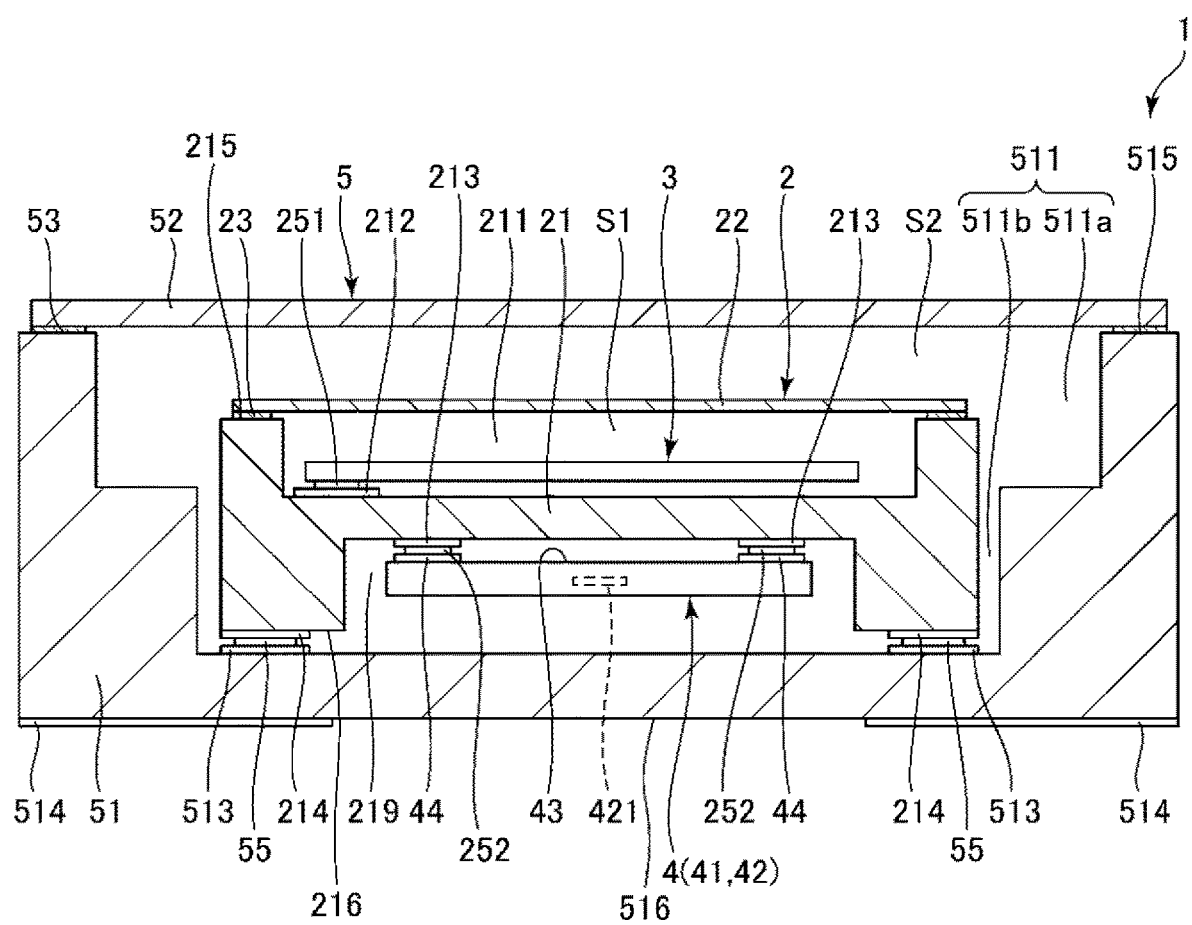
FIG. 12 is a cross-sectional view of an oscillator according to a first reference example.

FIG. 12 is a cross-sectional view of the oscillator according to the first reference example.

Hereinafter, differences between the oscillator of the first reference example and the above-described embodiment will be mainly described, and description of similar matters will be omitted. The oscillator of the first reference example is mainly the same as the oscillator of the first embodiment except that the direction of the inner package is different. In FIG. 12, the same reference numerals are given to the same configurations as in the above-described embodiment.

As shown in FIG. 12, in the oscillator 1 of the present reference example, the base 21 includes the recessed portion 211 that opens on the upper surface 215 thereof and the recessed portion 219 that opens on the bottom surface 216 (lower surface) thereof. The resonation element 3 is disposed in the recessed portion 211, and the circuit element 4 is disposed in the recessed portion 219. In addition, the opening of the recessed portion 211 is covered with the lid 22, whereby the storage space S1 for housing the resonation element 3 is formed. On the other hand, the opening of the recessed portion 219 is not closed, and the space inside the recessed portion 219 is connected to the storage space S2. That is, the space inside the recessed portion 219 constructs a part of the storage space S2.

In addition, the internal terminal 212 is disposed on the bottom surface of the recessed portion 211. The resonation element 3 is fixed to the bottom surface of the recessed portion 211 via the joining member 251 and is also electrically connected to the internal terminal 212. Further, the internal terminal 213 is disposed on the bottom surface of the recessed portion 219. The circuit element 4 is disposed such that the active surface 43 thereof faces upward (the bottom surface side of the recessed portion 219), is fixed to the bottom surface of the recessed portion 219 via the joining member 251, and is electrically connected to the internal terminal 213. Here, as the joining member 251, although not particularly limited, it is preferable to use a metal bump such as a gold bump, a silver bump, a copper bump, a solder bump or the like, for example. Since substantially no outgas is generated from the metal bump, the pressure in the storage space S2 may be maintained at a lower level (increase in pressure over time may be suppressed).

The inner package 2 having such a configuration is fixed to the bottom surface of the recessed portion 511 of the base 51 via the metal bump 55 on the bottom surface 216 of the base 21. In addition, the external terminal 214 of the inner package 2 and the internal terminal 513 of the outer package 5 are electrically connected via the metal bump 55. The metal bump 55 is not particularly limited, and for example, a gold bump, a silver bump, a copper bump, a solder bump or the like may be used. Since substantially no outgas is generated from the metal bump 55, the pressure in the storage space S2 may be maintained at a lower level (increase in pressure over time may be suppressed).

According to the above configuration, since the external heat is transmitted to the resonation element 3 and the circuit element 4 via the outer package 5 and the inner package 2, the heat transmission path from the outside to the resonation element 3 and the circuit element 4 may be sufficiently lengthened. Furthermore, as described above, since both the circuit element 4 and the resonation element 3 are attached to the inner package 2, the thermal coupling between the resonation element 3 and the circuit element 4 is improved (thermal bonding is promoted) and the temperature difference between the resonation element 3 and the circuit element 4 may be suppressed to be smaller. Therefore, the temperature of the resonation element 3 may be accurately detected by the temperature sensitive element 421.

With the above effect, it is possible to realize the temperature compensation function by the circuit element 4 with high accuracy and to obtain the oscillator 1 having stable temperature characteristics. In particular, in the embodiment, since the inner package 2 and the outer package 5 are connected by the metal bumps 55, the heat transmission route from the outer package 5 to the inner package 2 may be made sufficiently small (thin). Therefore, external heat is less likely to be transmitted to the resonation element 3, and the above-described effect may be achieved more remarkably.

Second Reference Example

Next, an oscillator according to a second reference example will be described.

Figure 13:
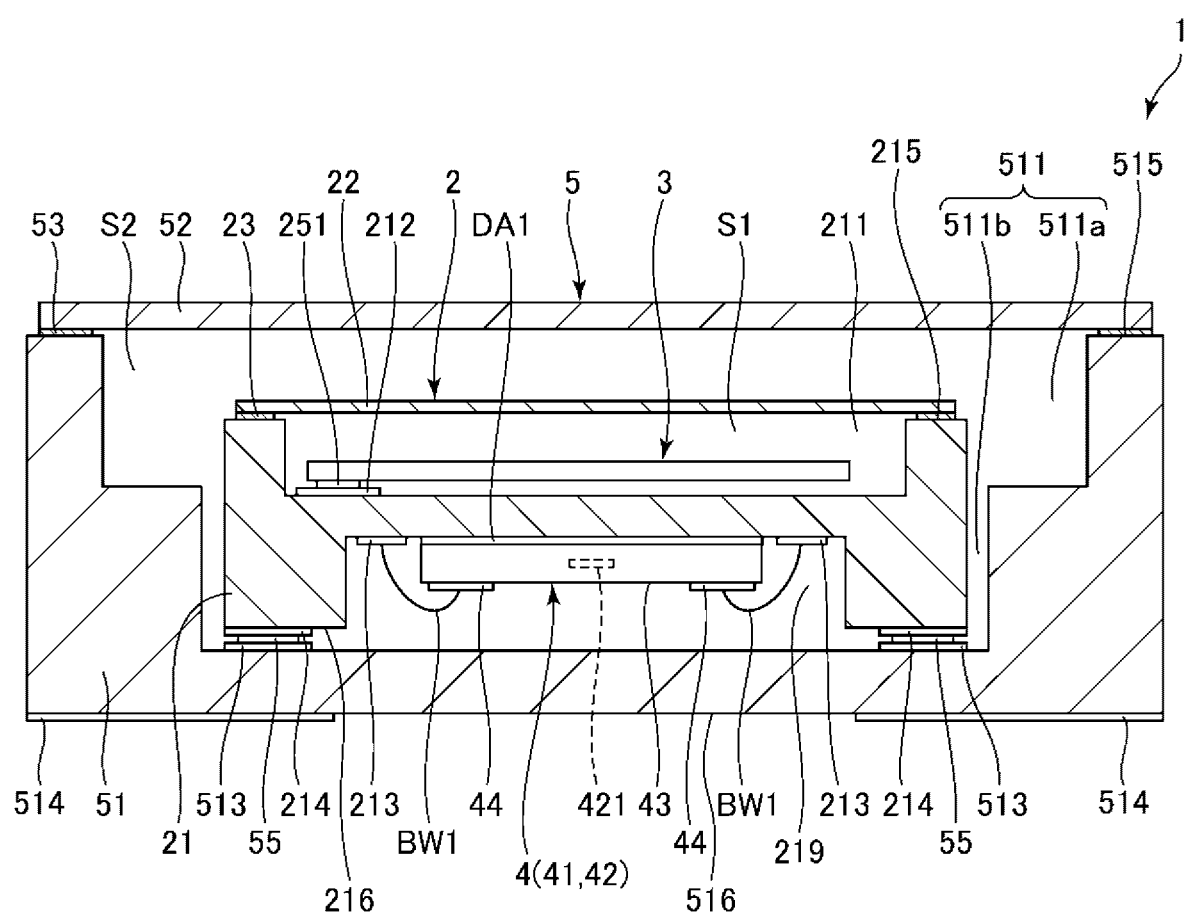
FIG. 13 is a cross-sectional view of an oscillator according to a second reference example.

FIG. 13 is a cross-sectional view of the oscillator according to the second reference example.

Hereinafter, differences between the oscillator of the second reference example and the above-described reference example will be mainly described, and description of similar matters will be omitted. The oscillator of the second reference example is similar to the oscillator of the first embodiment except that the direction of the circuit element 4 is mainly different. In FIG. 13, the same reference numerals are given to the same configurations as in the above-described embodiment.

As shown in FIG. 13, in the oscillator 1 of the present reference example, the circuit element 4 is fixed to the bottom surface of the recessed portion 219 via the die attach material DA1 such that the active surface 43 thereof faces downward. The circuit element 4 and each internal terminal 213 are electrically connected via the bonding wire BW1.

The die attach material DA1 is not particularly limited, and various adhesives such as an epoxy type adhesive and a silicone type adhesive, various metal pastes such as a solder, a gold braze, a silver braze, or the like may be used, for example. However, as the die attach material DA1, it is preferable to use a metal paste. In addition, since substantially no outgas is generated from the metal base, the pressure in the storage space S2 may be maintained at a lower level (increase in pressure over time may be suppressed). Therefore, it is possible to reduce the heat convection generated in the storage space S2 and to effectively reduce the temperature fluctuation of the resonation element 3 and the circuit element 4 due to external heat.

The oscillator, the electronic apparatus, and the vehicle according to the invention have been described based on the illustrated embodiments, but the invention is not limited thereto, and the configuration of each portion may be replaced with an arbitrary configuration having the same function. In addition, other optional components may be added to the invention. In addition, the invention may be a combination of arbitrary two or more configurations (features) of the above embodiments.

The entire disclosure of Japanese Patent Application No. 2018-035889, filed Feb. 28, 2018 is expressly incorporated by reference herein.

What is claimed is:

1. An oscillator comprising:
    a resonation element;
    a temperature sensitive element;
    a circuit element including the temperature sensitive element;
    a first package that is airtightly sealed and houses the resonation element and the circuit element; and
    a second package that is airtightly sealed and houses the first package,
    wherein:
    the first package includes
        a first base that has two first main surfaces and a first recessed portion provided on one of the first main surfaces, and
        a first lid that is joined to the first base so as to close an opening of the first recessed portion, and
    the second package includes
        a second base that has two second main surfaces and a second recessed portion provided on one of the second main surfaces, and
        a second lid that is joined to the second base so as to close an opening of the second recessed portion, and
    a center of the resonation element overlaps the circuit element in plan view.

2. The oscillator according to claim 1, wherein the first package includes
    a first internal terminal that is disposed so as to face an inside of the first recessed portion of the first base, and
    a first external terminal that is disposed on the other first main surface of the first base and electrically connected to the first internal terminal, and
    the second package includes
    a second internal terminal that is disposed so as to face an inside of the second recessed portion of the second base, and
    a second external terminal that is disposed on the other second main surface of the second base and electrically connected to the second internal terminal.

3. The oscillator according to claim 2, wherein the first base of the first package is attached to the second base.

4. The oscillator according to claim 3, further comprising:
    a conductive first joining member that is positioned between the first base and the second base and joins the first base and the second base,
    wherein the first external terminal and the second internal terminal are electrically connected via the first joining member.

5. The oscillator according to claim 2, wherein the first lid of the first package is attached to the other of the second main surfaces of the second base which defines a bottom of the second recessed portion.

6. The oscillator according to claim 5, further comprising:
    a first joining member that is positioned between the first lid and the second base and joins the first lid and the second base; and
    a first bonding wire electrically connecting the first external terminal and the second internal terminal.

7. The oscillator according to claim 1, wherein the temperature sensitive element is a thermistor.

8. The oscillator according to claim 2, further comprising:
    a temperature compensation circuit including the temperature sensitive element that is formed on the circuit element.

9. The oscillator according to claim 8, further comprising:
    a conductive second joining member for attaching the circuit element to the first package,
    wherein the circuit element and the first internal terminal are electrically connected via the second joining member.

10. The oscillator according to claim 8, further comprising:
    a second joining member for attaching the circuit element to the first package; and
    a second bonding wire electrically connecting the circuit element and the first internal terminal.

11. The oscillator according to claim 1, wherein an inside of the first package is filled with an inert gas.

12. The oscillator according to claim 1, wherein a pressure in the second package is lower than a pressure in the first package.

13. The oscillator according to claim 12, wherein a pressure in the second package is lower than an atmospheric pressure.

14. An electronic apparatus comprising:
    the oscillator according to claim 1.

15. A vehicle comprising:
    the oscillator according to claim 1.

* * * * *